United States Patent [19]

Motohama et al.

[11] Patent Number: 5,894,424

[45] Date of Patent: Apr. 13, 1999

[54] SEMICONDUCTOR TESTING APPARATUS

[75] Inventors: Masayuki Motohama, Takatsuki; Junichi Hirase, Nagaokakyo, both of Japan

[73] Assignee: Matsushita Electrical Industrial Co., Ltd., Osaka-Fu, Japan

[21] Appl. No.: 08/857,095

[22] Filed: May 15, 1997

[51] Int. Cl.$^6$ .................................................. G11C 29/00
[52] U.S. Cl. .................... 364/579; 364/580; 371/21.1; 371/22.1; 371/25.1; 395/183.06; 395/183.07; 395/183.08; 395/183.12
[58] Field of Search ............... 395/183.06, 183.08, 395/651, 183.12, 750.07, 709, 183.07; 364/579, 580; 371/21.1, 22.1, 25.1

[56] References Cited

U.S. PATENT DOCUMENTS

| | | |
|---|---|---|
| 4,631,724 | 12/1986 | Shimizu ........................ 371/21.1 |
| 4,672,534 | 6/1987 | Kamiya ......................... 395/183.06 |
| 4,718,007 | 1/1988 | Yukino .......................... 395/750.07 |
| 4,933,941 | 6/1990 | Eckard et al. ................. 395/183.07 |
| 5,107,498 | 4/1992 | Hagihara et al. .............. 395/183.12 |
| 5,463,637 | 10/1995 | Hayashi ........................ 371/21.1 |
| 5,511,198 | 4/1996 | Hotta ............................ 395/709 |
| 5,673,274 | 9/1997 | Yoshida ........................ 371/22.1 |
| 5,704,033 | 12/1997 | Park .............................. 395/183.06 |

Primary Examiner—Hezron E. Williams
Assistant Examiner—Hien Vo
Attorney, Agent, or Firm—Sheridan Ross P.C.

[57] ABSTRACT

The present invention offer a semiconductor testing apparatus which is able to test all functions of a semiconductor device in a short time. The semiconductor testing apparatus comprises a conditional imperative statement part storing therein all statements concerning conditional setting for the measuring means, a first comparison part for comparing statement received from the control means with the respective statements stored in the conditional imperative statement part, and a second comparison part for comparing the statements received from the control means with the respective statements stored in the memory means.

12 Claims, 7 Drawing Sheets

F I G. 3
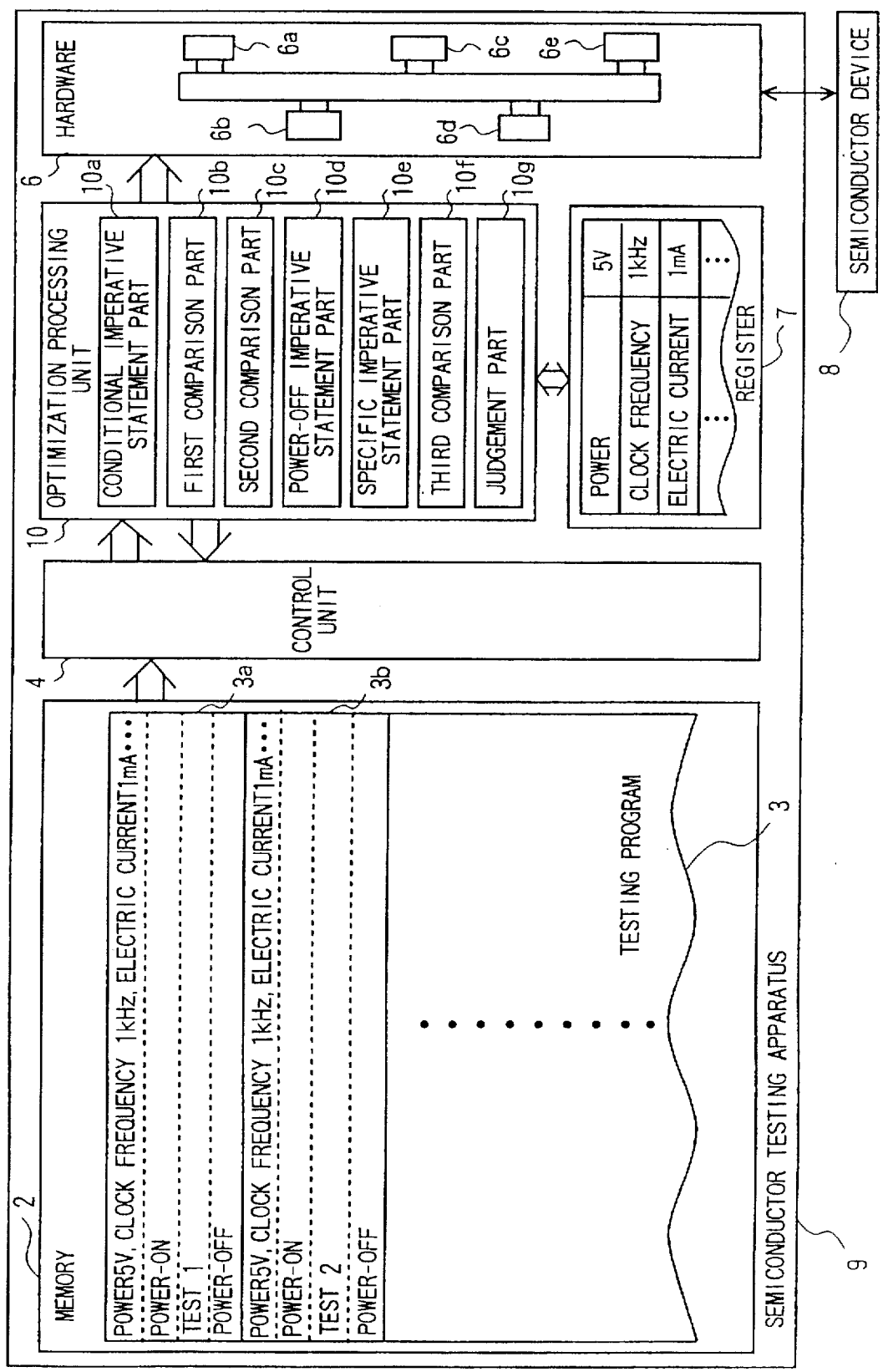

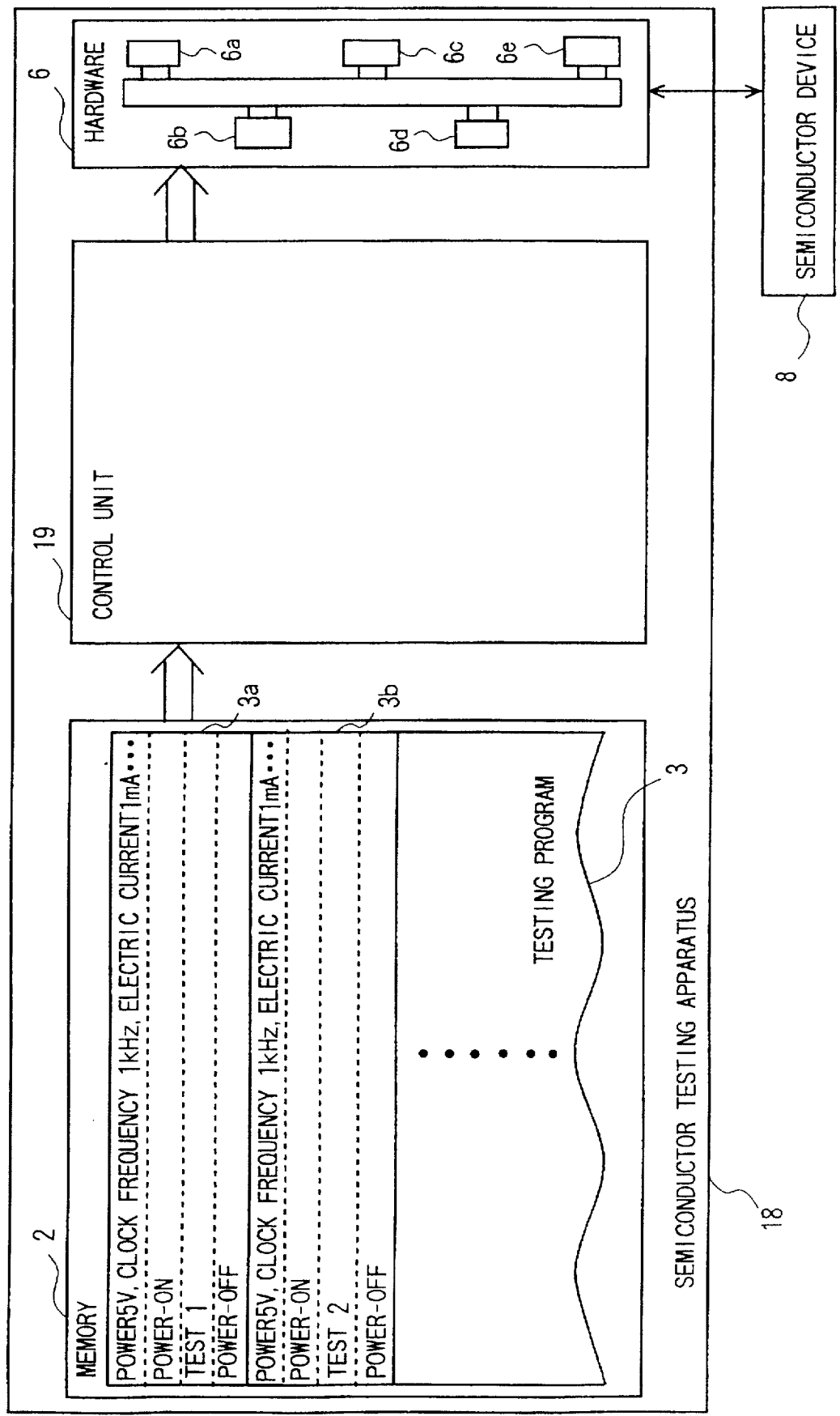

SEMICONDUCTOR TESTING APPARATUS

BACKGROUND OF THE INVENTION

The present invention relates to a semiconductor testing apparatus for executing functional tests of a semiconductor device.

In case of executing functional tests of a semiconductor device, generally the semiconductor device is operated using the procedure of a testing program, thereby to determine whether it outputs an expected data or not. And from the result of the output, whether the semiconductor device is good or no good is judged. As a result of having a great variety of functions, however, in case of testing all functions of the semiconductor device, it is necessary to prepare a testing program for the respective functional test and to test all functions running these testing programs by turns. As a variety of functional tests of the semiconductor device, there are, for example, a test of read only memory(ROM), a test of random access memory(RAM), etc.

In the following, a conventional semiconductor testing apparatus 18 is elucidated in detail referring to FIG. 7. The conventional semiconductor testing apparatus 18 consists of a control unit 19 that is a central processing unit and so on, a memory 2 for storing a testing program 3 to execute each functional tests of a semiconductor device 8 and a hardware 6 for executing all functional tests of the semiconductor device 8. Usually as a testing program 3, plural programs (3a, 3b, - - - ) are prepared for the respective functional tests (T1, T2, - - - ) of the semiconductor device 8. The hardware 6 consists of plural units 6a, 6b, 6c, 6d, 6e, the respective units 6a, 6b, 6c, 6d, 6e taking shares of the respective functional tests (T1, T2, - - - ) of the semiconductor device 8.

The control unit 19 reads one of statements configured in the testing program 3 in the memory 2, decodes it and order the hardware 6 to execute the decoded statement. After the hardware 6 finish executing of the decoded statement, the control unit 19 reads the next statement configured in the testing program 3.

As statements configured in the testing program 3, there are, for example, a statement concerning the conditional setting for the hardware 6, a statement concerning the power-on for the hardware 6, a statement concerning the power-off for the hardware 6 and a statement concerning the execution of functional tests of the semiconductor device 8.

In case of this conventional example, for instance, after the hardware 6 finishes executing of the program 3a, the control unit 19 reads the next program 3b in the memory 2 and sets the condition of the respective units 6a, 6b, 6c, 6d, 6e of the hardware 6. In other words, in the case that it is not necessary to alter the conditional setting of the unit 6a, that is to say, even in the case that the conditional setting of the unit 6a in the next functional test may be the same as the previous conditional setting of the unit 6a, the condition of the unit 6a using the procedure of the program 3b is set again.

The statement concerning the power-off for the hardware 6 is configured at the end of the respective programs (3a, 3b, - - - ) for the purpose of protecting the semiconductor testing apparatus 18 and the semiconductor device 8. The statement concerning the power-off for the hardware 6 is executed by the control unit 19 and it turns off power to the hardware 6 by the control unit 19. And in the occasion that the next functional test is executed, the statement concerning the power-on for the hardware 6 is executed by the control unit 19. But in the case that the conditional setting of the hardware 6 in the next functional test is the same as the previous conditional setting of the hardware 6, or in the case that to alter the conditional setting of the hardware 6 under the power-on has no adversely influence upon the semiconductor device 8 and the semiconductor testing apparatus 18, it is not necessary to turn off power to the hardware 6.

In the above-mentioned two cases, unnecessary statement concerning the conditional setting for the hardware 6, unnecessary statement concerning the power-off for the hardware 6 and unnecessary statement concerning the power-on for the hardware 6 has been executed and it has wasted time. As a result, there was a defect that the conventional semiconductor testing apparatus 18 takes unnecessarily long time to test all functions of the semiconductor device 8.

Hitherto, as for the means to avoid taking this unnecessarily long time, the respective programs (3a, 3b, - - - ) are optimized so that a renewal testing program deleted all of unnecessary statements is drawn up. And an example of an optimization processing system is shown in FIG. 6. In the case shown in FIG. 6, a testing program 15 is optimized and a renewal testing program 17 is drawn up, wherein all of unnecessary statement is deleted by the optimization processing system 16.

In case of this example shown in FIG. 6, however, it is necessary to develop each system and each software to optimize each programs (15a, 15b, - - - ) to prepare for testing the respective functions of the semiconductor device. And as a result a huge cost and process are required.

BRIEF SUMMARY OF THE INVENTION

The present invention offer a semiconductor testing apparatus which is able to test all functions of a semiconductor device in a short time.

A semiconductor testing apparatus of the present invention comprises, control means for controlling respective parts of the semiconductor testing apparatus, recording means for storing plural testing programs for the respective functional tests of a semiconductor device, measuring means for executing the functional test using the procedure of the testing programs, memory means for storing the latest statement concerning the conditional setting for the measuring means, and optimization processing means including a conditional imperative statement part storing therein all statements concerning the conditional setting for the measuring means, a first comparison part for comparing statement received from the control means with the respective statements stored in the conditional imperative statement part, and a second comparison part for comparing the statements received from the control means with the respective statements stored in the memory means, in the optimization processing means, upon receiving one of statements described in the testing programs from the control means, the first comparison part comparing the received statement with the respective statements stored in the conditional imperative statement part, and (i) when the received statement agrees with none of the statements stored in the conditional imperative statement part, the optimization processing means sends the received statement to the measuring means, or (ii) when the received statement agrees with one of the statements stored in the conditional imperative statement part, the second comparison part compares the received statement with the respective statements stored in the memory means, and (ii-1) when the received statement agrees with one of the statements stored in the memory means, the optimization processing means sends a completion output to the control means, or (ii-2) when the received statement agrees with none of the statements stored in the memory means, the optimization processing means sends a completion output to the control means after revising the received statement in the memory means and again setting condition of the measuring means by the optimization processing means.

According to the present invention, only when the conditional setting of the measuring means described in the received statement is different from the latest conditional setting of the measuring means stored in the memory means, the conditional setting for the measuring means is renewed. As a result, even in the case of a non-optimized testing program, there is no fear of executing unnecessary statement concerning conditional setting for the measuring means, and hence it is possible to shorten the time to execute all functional tests of the semiconductor device using the procedure of the testing program.

A semiconductor testing apparatus of another aspect of the invention comprises, control means for controlling respective parts of the semiconductor testing apparatus, recording means for storing plural testing programs for the respective functional tests of a semiconductor device, measuring means for executing the functional test using the procedure of the testing programs, memory means for storing the latest statement concerning conditional setting for the measuring means, and optimization processing means including a conditional imperative statement part storing therein all statements concerning conditional setting for the measuring means, a first comparison part for comparing the statement received from the control means with the respective statements stored in the conditional imperative statement part, a second comparison part for comparing the statement received from the control means with the respective statements stored in the memory means, a judgement part for judging whether the statement received from the control means is a statement concerning power-off for the measuring means or not, a power-off imperative statement part for storing the statement concerning the power-off for the measuring part, a specific imperative statement part storing therein specific statements which may adversely influence upon the semiconductor device and the semiconductor testing apparatus at execution during power-on of the measuring means, and a third comparison part for comparing the statement received from the control means with the respective specific statements stored in the specific imperative part, in the optimization processing means, upon receiving one of statements described in the testing programs from the control means, the judgement part judges whether the received statement is the statement concerning the power-off for the measuring means, and (i) when the received statement is the statement concerning the power-off for the measuring means, the optimization processing means does not execute the received statement and stores the received statement in the power-off imperative statement part, or (ii) when the received statement is not the statement concerning the power-off for the measuring means, the first comparison part compares the received statement with the respective statements stored in the conditional imperative statement part, and (ii-1) when the received statement agrees with none of the statements stored in the conditional imperative statement part, the optimization processing means sends the received statement to the measuring means, or (ii-2) when the received statement agrees with one of the statements stored in the conditional imperative statement part, the second comparison part compares the received statement with the respective statements stored in the memory means, and (ii-2-1) when the received statement agrees with one of the statements stored in the memory means, the optimization processing means sends a completion output to the control means, or (ii-2-2) when the received statement agrees with none of the statements stored in the memory means, the third comparison part compares the received statement with the respective specific statements stored in the specific imperative statement part, and (ii-2-2-1) when the received statement agrees with one of the specific statements stored in the specific imperative statement part, the optimization processing means executes the statement concerning the power-off for the measuring means stored in the power-off imperative statement part and the optimization processing means sends a completion output to the control means after revising the received statement in the memory means and again setting condition of the measuring means by the optimization processing means, or (ii-2-2-2) when the received statement agrees with one of the specific statements stored in the specific imperative statement part, the optimization processing means sends a completion output to the control means after revising the received statement in the memory means and again setting condition of the measuring means by the optimization processing means without executing the statement concerning the power-off for the measuring means.

According to the above-mentioned apparatus, renewal of the conditional setting of the measuring means is made only in the case that the conditional setting for the measuring means described in the received statement is different from a statement concerning the latest conditional setting for the measuring means stored in the memory means. Only in the case that the statement concerning the conditional setting for the measuring means agrees with one of specific statements stored in the specific imperative statement part, the statement concerning the power-off for the measuring means is executed. As a result, even in the case of a non-optimized testing program, there is no fear of executing unnecessary statement concerning conditional setting for the measuring means, unnecessary statement concerning the power-off for the measuring means and unnecessary statement concerning the power-off for the measuring means. Accordingly, it is possible to shorten the time to execute all functional tests of the semiconductor device using the procedure of the testing program.

In the semiconductor testing apparatus of another aspect of the invention, the measuring means comprises plural units, and the optimization processing unit judges whether the units is set condition again or not.

According to the above-mentioned apparatus, in the case that a part or some parts of the conditional setting at the next functional test is different from those of the previous conditional setting, it is only renewed the conditional setting of units having the difference. Therefore, it is possible to further shorten the time to execute all functional tests of the semiconductor device using the procedure of the testing program.

In the semiconductor testing apparatus of another aspect of the invention, the measuring means comprises plural units, and the optimization processing unit judges whether it is turned off power to the respective units or not.

According to the above-mentioned apparatus, since the power is turned off for the only unit that it is necessary to turn off power, it is possible to further shorten the time to execute all functional tests of the semiconductor device using the procedure of the testing program.

In a semiconductor testing apparatus of another aspect of the invention, the control means includes faculty of the optimization processing means and the memory means.

According to the above-mentioned apparatus, since it is not necessary to improve the semiconductor testing apparatus mechanically, it is possible to further shorten the time to execute all functional tests of the semiconductor device using the testing program in a short time and with a moderate price.

BRIEF DESCRIPTION OF THE SEVERAL VIEWS OF THE DRAWINGS

FIG. 3 is a schematic drawing of second Embodiment of the semiconductor testing apparatus of the present invention;

FIG. 7 is a schematic drawing of a conventional semiconductor testing apparatus.

DETAILED DESCRIPTION OF THE INVENTION

Preferred Embodiments of a semiconductor testing apparatus in accordance with the present invention will be elucidated in detail referring to the accompanying drawing FIGS. 1 to 7.

FIRST EMBODIMENT

Figure 1:
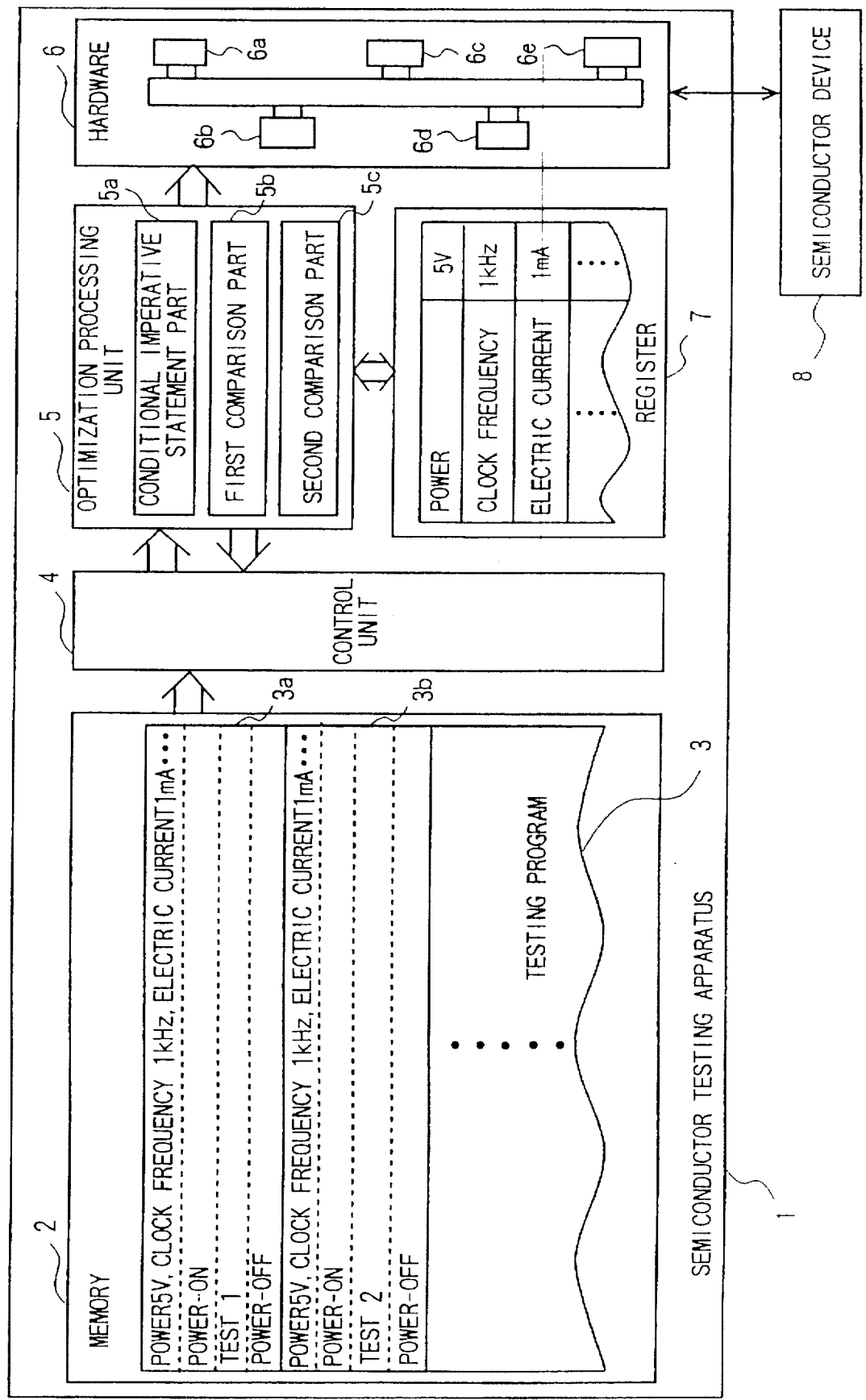
FIG. 1 is a schematic drawing of first Embodiment of the semiconductor testing apparatus of the present invention.

This first Embodiment relates to a preferred semiconductor testing apparatus in accordance with the present invention. In the following, the semiconductor testing apparatus 1 shown in FIG. 1 is elucidated with reference to a flow chart of FIG. 2, which flow chart shows an example of operation for the semiconductor testing apparatus 1.

In the first place, configuration of the semiconductor testing apparatus 1 is detailed.

The semiconductor testing apparatus 1 consists of a memory 2 as a storing means, a control unit 4 as a control means, an optimization processing unit 5 as an optimization processing means, a hardware 6 as a measuring means and a register 7 as a memory means.

The memory 2 is for storing a testing program 3 that is program to test functions of the semiconductor device 8. Since it is necessary to prepare a program for testing the respective functions of a semiconductor device 8, the testing program 3 is composed of plural programs ($3a$, $3b$, - - - ). A statement concerning the conditional setting for the hardware 6, a statement concerning the power-on for the hardware 6, a statement concerning the execution of the functional test of the semiconductor device 8 and a statement concerning the power-off for the hardware 6 are provided in the mentioned order in the respective programs ($3a$, $3b$, - - - ). Moreover, a statement concerning the end of the testing program 3 is configured at the end of the testing program 3. Hereupon, these statement concerning the conditional setting for the hardware 6 are, for example, a statement concerning the value of the power-level, a statement concerning the clock frequency, a statement concerning the value of electric current. The control unit 4 is, for example, a central processing unit and is for controlling each unit of the semiconductor testing apparatus 1. The hardware 6 consists of plural units $6a$, $6b$, $6c$, $6d$, $6e$, the respective units $6a$, $6b$, $6c$, $6d$, $6e$ taking shares of the respective functional tests (T1, T2, - - - ). The register 7 is for storing the latest statement concerning the conditional setting of the hardware 6. At the time when the functional tests of the semiconductor device 8 begin, there is no statement concerning the conditional setting for the hardware 6 in the register 7. The optimization processing unit 5 is composed of a conditional imperative statement part $5a$, a first comparison part $5b$, and a second comparison part $5c$. The conditional imperative statement part $5a$ is, for example, made up of a table and all statements concerning the conditional setting for the hardware 6 is stored in the conditional imperative statement part $5a$. The first comparison part $5b$ is for comparing the statement which the optimization processing unit 5 received from the control unit 4 with the respective statements stored in the conditional imperative statement part $5a$, and for judging whether they agree with or not. The second comparison part $5c$ is for comparing the statement which the optimization processing unit 5 received from the control unit 4 with the respective statements stored in the register 7 and for judging whether they agree with or not.

Figure 2:
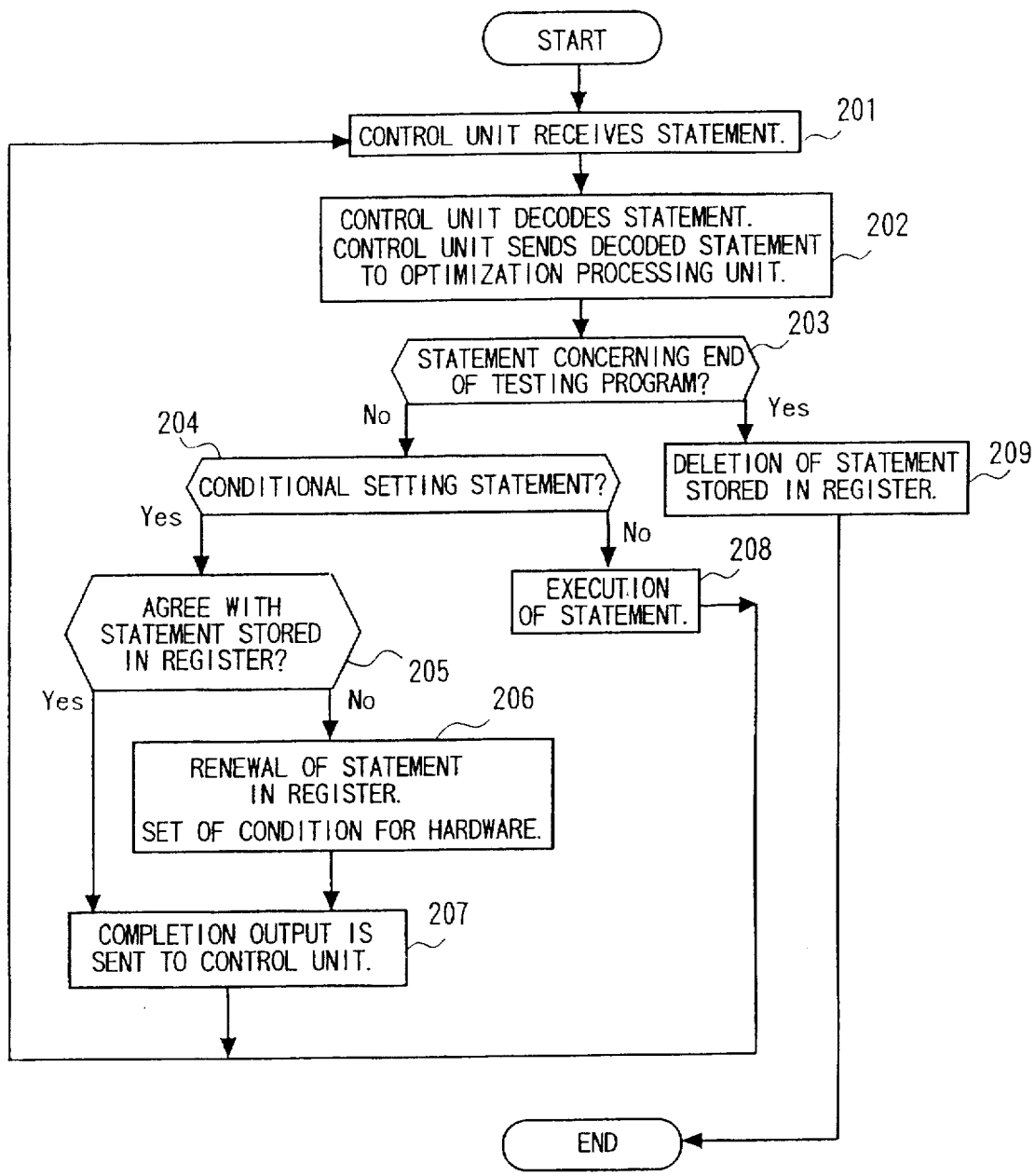
FIG. 2 is a flow chart shown operation of first Embodiment.

In the next place, referring to the flow chart of FIG. 2, respective steps to make the semiconductor testing apparatus 1 execute functional tests (T1, T2, - - - ) of the semiconductor device 8 are detailed.

STEP 201 : The control unit 4 receives, one by one statement out of the testing program 3 in the memory 2, and then the flow advances to step 202.

STEP 202 : The control unit 4 decodes the statement received by the control unit 4, and sends the decoded statement to the optimization processing unit 5, and then the flow advances to step 203.

STEP 203 : The optimization processing unit 5 judges whether the received statement agrees with the statement concerning the end of the testing program 3 or not. When the received statement agrees with the statement concerning the end of the testing program 3, the flow advances to step 209. When it does not agree, the flow advances to step 204.

STEP 204 : The first comparison part 5b compares the received statement with the respective statements stored in the conditional imperative part 5a and judges whether the received statement agrees with one of statements concerning the conditional setting for the hardware 6 or not. When the received statement agrees with one of statements concerning the conditional setting for the hardware 6, the flow advances to step 205. When it agrees none of statements concerning the conditional setting for the hardware 6, the flow advances to step 208.

STEP 205 : The second comparison part 5c compares the received statement with the respective statements stored in register 7 and judges whether the received statement agrees with one of statements in the register 7 or not. When the received statement agrees with one of statements stored in the register 7, the flow advances to step 207. When it agrees none of statements in the register 7, the flow advances to step 206.

STEP 206 : The received statement is stored in the register 7. At the same time, the optimization processing unit 5 sends the received statement to the hardware 6 and sets the condition of the hardware 6. And the flow advances to step 207.

STEP 207 : The optimization processing unit 5 sends a completion output which states that the received statement is executed to the control unit 4. Thereupon, the optimization processing unit 5 requires the control unit 4 to read the next statement of the testing program 3 in memory 2. And the flow advances to step 201.

STEP 208 : The optimization processing unit 5 sends the received statement to the hardware 6. The respective units 6a, 6b, 6c, 6d, 6e execute a functional test of the semiconductor device 8 using the procedure of the received statement. And thereby whether the function of the semiconductor device 8 is normal or not is judged and the result of the functional test is output. And the flow advances to step 201.

STEP 209 : The optimization processing unit 5 forcely deletes the statements from the register 7, and all functional tests of the semiconductor device 8 finishes.

As mentioned above, the semiconductor testing apparatus 1 executes the statement concerning the conditional setting for the hardware 6, only in the case that the conditional setting for the hardware 6 described in the received statement is different from the latest conditional setting for the hardware 6 stored in the register 7. As a result, for the testing program 3 which is not optimized, execution of unnecessary statement concerning the conditional setting for the hardware 6 is dispensed with. Thereby, the time for executing all functional tests of the semiconductor device 8 using the procedure of the testing program 3 can be shortened.

An alternative way may be such that whether it is necessary to renew the individual conditional setting of the respective units 6a, 6b, 6c, 6d, 6e is judged and then the conditional setting of the respective units 6a, 6b, 6c, 6d, 6e are altered. In such case, the conditional setting at the next functional test is made only for the unit that is different from the previous conditional setting. Therefore, it is possible to further shorten the time to execute all functional tests of the semiconductor device 8.

SECOND EMBODIMENT

This second Embodiment relates to another semiconductor testing apparatus in accordance with this present invention. In the following, the semiconductor testing apparatus 9 shown in FIG. 3 is elucidated with reference to a flow chart of FIG. 4, which flow chart shows an example of operation for the semiconductor testing apparatus 9.

In the first place, configuration of the semiconductor testing apparatus 9 is detailed.

A unit of the semiconductor testing apparatus 9 shown in FIG. 3 which is different from the corresponding unit of the semiconductor testing apparatus 1 shown in FIG. 1 is only in an optimization processing unit 10. The optimization processing unit 10 is composed of a conditional imperative statement part 10a, a first comparison part 10b, a second comparison part 10c, a power-off imperative statement part 10d, a specific imperative statement part 10e, a third comparison part 10f, and a judgement part 10g. The conditional imperative statement part 10a is, for example, made up of a table and all statements concerning the conditional setting for the hardware 6 is stored in the conditional imperative statement part 10a. The first comparison part 10b is for comparing the statement that the optimization processing unit 10 received from the control unit 4 with the respective statements stored in the conditional imperative statement part 10a and for judging whether they agree with or not. The second comparison part, 10c is for comparing the statements that the optimization processing unit 10 received from the control unit 4 with the respective statements stored in the register 7 and for judging whether they agree with each other or not. The power-off imperative statement part 10d is, for example, a register and is for storing the statement concerning the power-off for the hardware 6. A method of storing the statement concerning the power-off for the hardware 6 is, for example, a method of setting a flag. The specific imperative statement part 10e is, for example, a register and is for storing such specific statements that would have adverse influence upon the semiconductor device 8 and the semiconductor testing apparatus 9 on executing under the power-on of the hardware 6. Hereupon, the specific statements are, for example, a statement which switches a wide range of electric current and a statement which switches a relay of electric power. The third comparison part 10f is for comparing the statement received from the control unit 4 with the respective specific statements stored in the specific imperative part 10e and for judging whether they agree with or not. The judgement part 10g is for judging whether the statement received from the control unit 4 agrees with the statement concerning the power-off for the hardware 6 or not. As for those units other than the optimization processing unit 10, explanations are omitted since explanation of in the previous Embodiment is applicable thereto.

Figure 4:
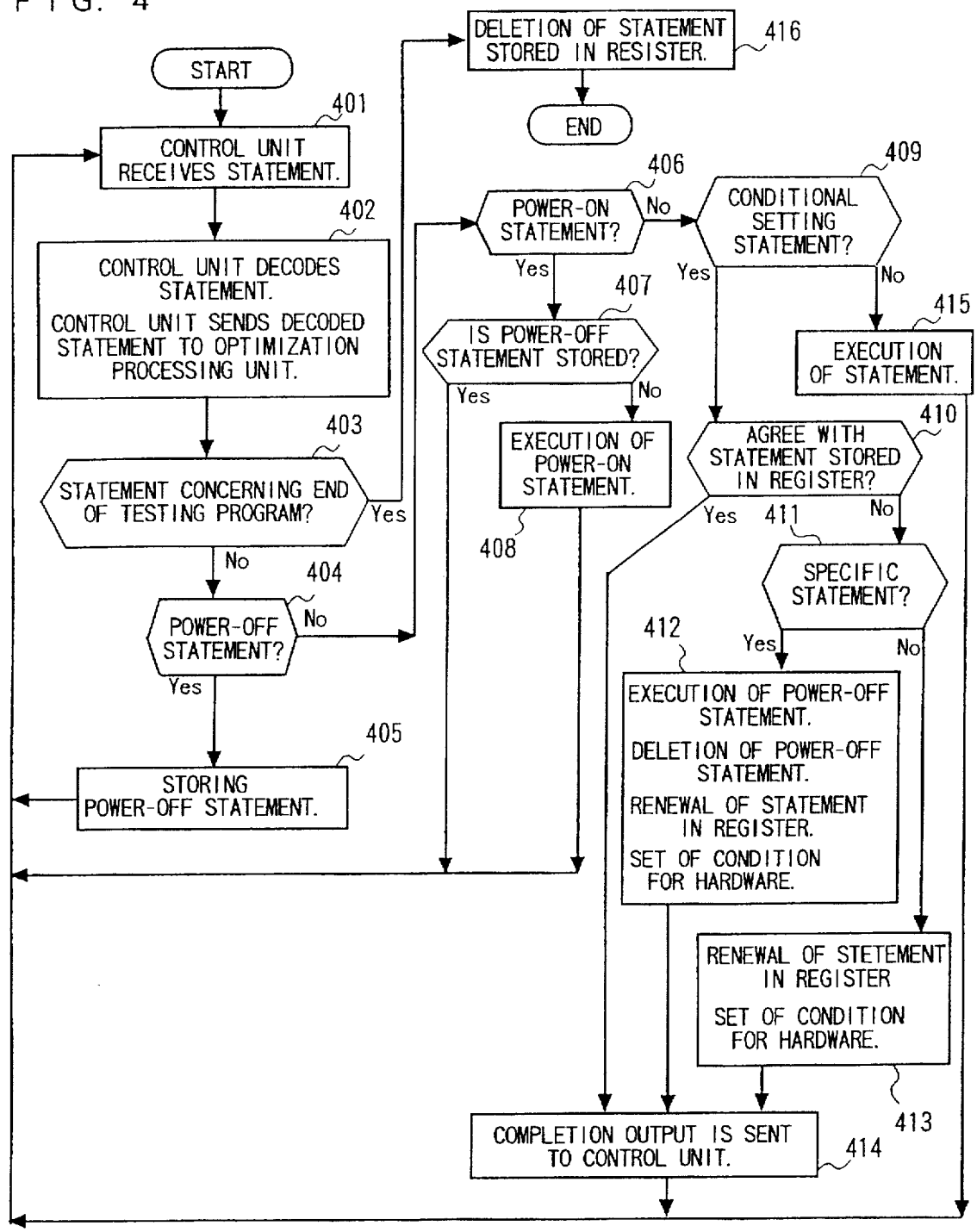
FIG. 4 is a flow chart shown operation of second Embodiment.

In the next place, referring to the flow chart of FIG. 4, respective steps to make semiconductor testing apparatus 9 execute functional tests (T1, T2, - - - ) of the semiconductor device 8 are detailed.

STEP 401 : The control unit 4 receives, one by one, statement out of the testing program 3 in the memory 2, and then the flow advances to step 402.

STEP 402 : The control unit 4 decodes the received statement, and sends the decoded statement to the optimization processing unit 10, and then the flow advances to step 403.

STEP 403 : The optimization processing unit 10 judges whether the received statement agrees with the statement concerning the end of the testing program 3 or not. When the received statement agrees with the statement concerning the end of the testing program 3, the flow advances to step 416. When it does not agree, the flow advances to step 404.

STEP 404 : The judgement part 10g judges whether the received statement agrees with the statement concerning the power-off for the hardware 6 or not. When the received statement does not agree with the statement concerning the power-off for the hardware 6, the flow advances to step 405. When it agrees, the flow advances to step 406.

STEP 405 : The received statement is stored into the power-off imperative statement part 10d instead of being sent to the hardware 6. At the same time, the optimization processing unit 10 demands the control unit 4 to read the next statement of the testing program 3 in memory 2. And the flow advances to step 406.

STEP 406 : The optimization processing unit 10 judges whether the received statement agrees with the statement concerning the power-on for the hardware 6 or not. When the received statement agrees with the statement concerning the power-on for the hardware 6, the flow advances to step 407. When it does not agree, the flow advances to step 409.

STEP 407 : The optimization processing unit 10 judges whether the statement concerning the power-off for the hardware 6 is stored in the power-off imperative statement part 10d or not. When the statement concerning the power-off for the hardware 6 is stored in the power-off imperative statement part 10d, the flow advances to step 401. When it is not stored, the flow advances to step 408.

STEP 408 : The optimization processing unit 10 sends the statement concerning the power-on for the hardware 6 to the hardware 6 and it is turned on power to the hardware 6. And the flow advances to step 401.

STEP 409 : The first comparison part 10d compares the received statement with the respective statements in the conditional imperative statement part 10a and judges whether the received statement agree with one of statements concerning the conditional setting for the hardware 6 or not. When the received statement agrees with one of statements concerning the conditional setting for the hardware 6, the flow advances to step 410. When it agrees with none of statements concerning the conditional setting for the hardware 6, the flow advances to step 415.

STEP 410 : The second comparison part 10c compares the received statement with the respective statements stored in register 7 and judges whether the received statement agrees with one of statements in the register 7 or not. When the received statement agrees with one of statements stored in the register 7, the flow advances to step 414. When it agrees none of statements in the register 7, the flow advances to step 411.

STEP 411 : The third comparison part 10f compares the received statement with the respective specific statement stored in the specific imperative statement part 10e and judges whether the received statement agrees with one of the specific statements or not. When the received statement agrees with one of specific statements, the flow advances to step 412. When it agrees with none of specific statements, the flow advances to step 413.

STEP 412 : The optimization processing unit 10 stores the received statement afresh in the register 7. The optimization processing unit 10 sends the statement concerning the power-off for the hardware 6 stored in the power-off imperative statement part 10d to the hardware 6 and deletes the statement concerning the power-off for the hardware 6 from the power-off imperative statement part 10d. It is turned off power to the hardware 6. The optimization processing unit 10 sends to the hardware 6 the received statement which is statement concerning the conditional setting for the hardware 6 and sets the condition of the hardware 6. And the flow advances to step 414.

STEP 413 : The optimization processing unit 10 stores the received statement afresh in the register 7. At the same time, the optimization processing unit 10 sends to the hardware 6 the received statement that is statement concerning the conditional setting for the hardware 6 and sets the condition of the hardware 6. And the flow advances to step 414.

STEP 414 : The optimization processing unit 10 sends a completion output which states that the received statement was executed to the control unit 4. Thereupon, the optimization processing unit 10 requires the control unit 4 to read the next statement of the testing program 3 in memory 2. And the flow advances to step 401.

STEP 415 : The optimization processing unit 10 sends the received statement to the hardware 6. The respective units 6a, 6b, 6c, 6d, 6e execute a functional test of the semiconductor device 8 using the procedure of the received statement. Thereby, whether the function of the semiconductor device 8 is normal or not is judged and the result of the functional test is output. And the flow advances to step 401.

STEP 416 : The optimization processing unit 10 forcely deleted the stored statement from the register 7. Moreover the optimization processing unit 10 sends the statement concerning the power-off for the hardware 6 to the hardware 6 and it is turned off power to the hardware 6. And all functional tests of the semiconductor device 8 finishes.

As mentioned above the semiconductor testing apparatus 9, only in the case that the conditional setting for the hardware 6 described in the received statement is different from the latest conditional setting for the hardware 6 in the register 7, the condition of the hardware 6 is set. In the functional tests of the semiconductor device 8, only when the statement concerning the conditional setting for the hardware 6 agrees with the statement stored in register 7, the statement concerning the power-off for the hardware 6 is executed. As a result, even in the case that the testing program 3 is not optimized, unnecessary statement concerning the conditional setting for the hardware 6, unnecessary statement concerning the power-off for the hardware 6 and unnecessary statement concerning the power-off for the hardware 6 is not executed. Therefore, it is possible to shorten the time to execute all functional tests of the semiconductor device 8 using the procedure of the testing program 3.

An alternative way may be such that a judgement is made whether it is necessary to renew the individual conditional setting of the respective units 6a, 6b, 6c, 6d, 6e, and then the conditional setting of the respective units 6a, 6b, 6c, 6d, 6e are altered. In such case, the conditional setting at the next functional test is made only for the unit that is different from the previous conditional setting. Therefore, the time to execute all functional tests of the semiconductor device 8 can be further shortened.

An alternative way may be such that whether it is necessary to be turned off power to the respective units 6a, 6b, 6c, 6d, 6e is judged and thereby turning off power for respective units 6a, 6b, 6c, 6d, 6e. In such case, it is turned off power to the only unit that is necessary to turn off power. Therefore, it is possible to further shorten the time to execute all functional tests of the semiconductor device 8 using the procedure of the testing program 3.

At the first Embodiment, it is configured that the optimization processing unit 5 sets the condition of the hardware 6. At the second Embodiment, it is configured that the optimization processing unit 10 sets the condition of the hardware 6 and executes turning off and turning on of power to the hardware 6. The reason why is that semiconductor testing apparatus of such configuration is empirically confirmed to be capable of processing more rapidly than a semiconductor testing apparatus which sets the condition of a hardware and executes turning off and turning on of power to a hardware, for instance, in mechanical way.

THIRD EMBODIMENT

This third Embodiment relates to still other semiconductor testing apparatus in the present invention.

Figure 5:
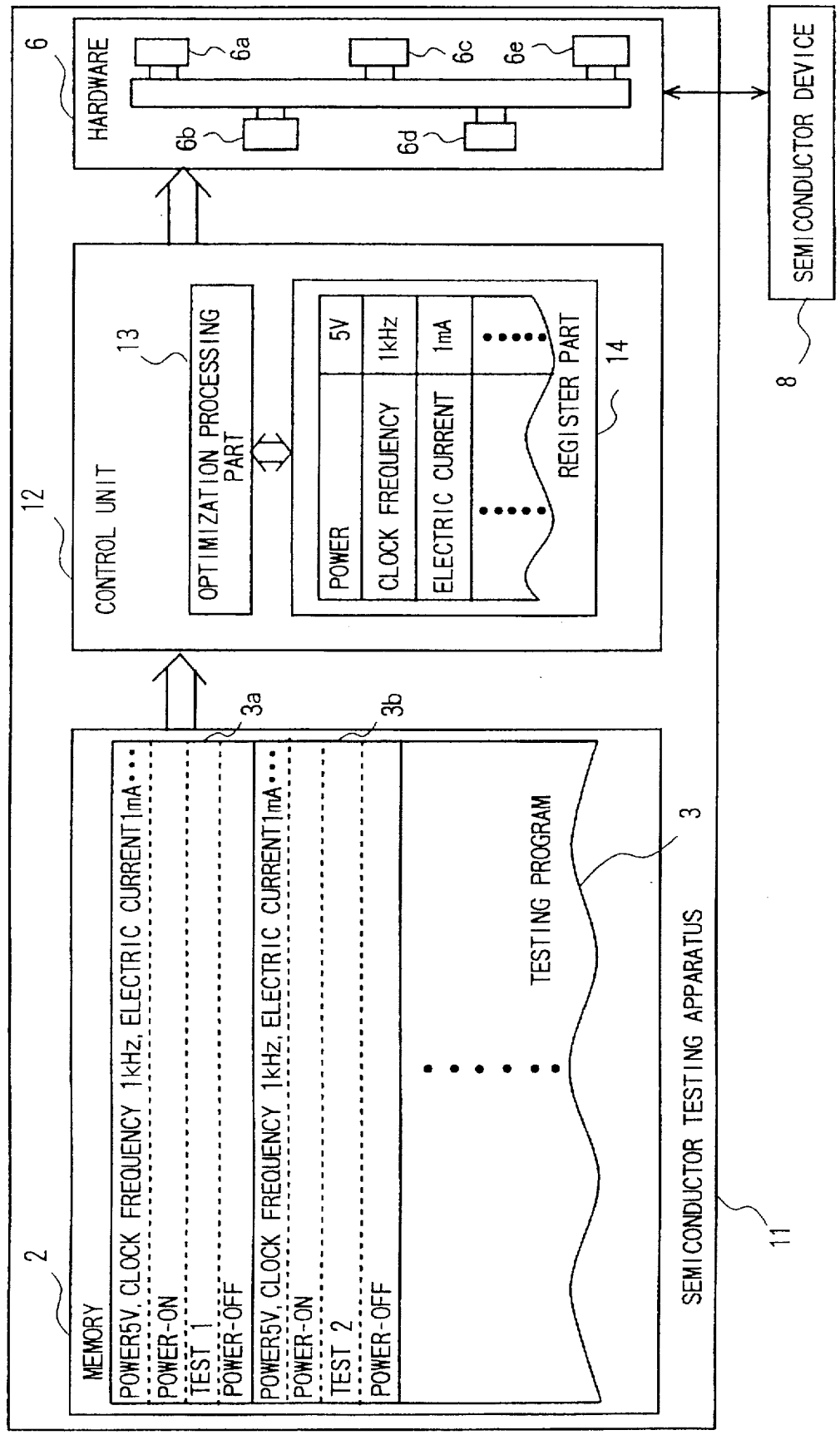
FIG. 5 is a schematic drawing of third Embodiment of the semiconductor testing apparatus of the present invention.
Figure 6:
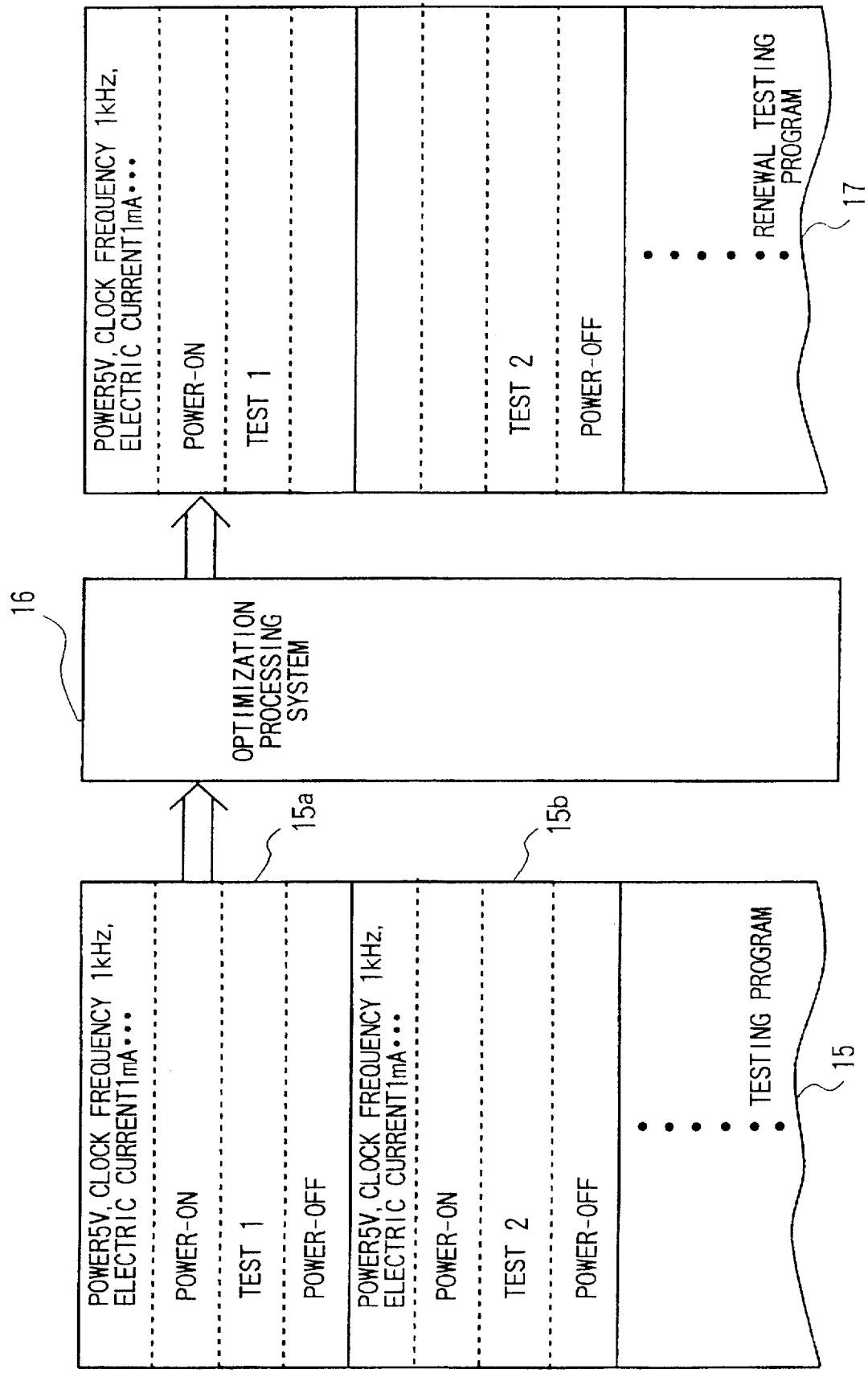
FIG. 6 is a system to optimize a testing program.

In the first place, the semiconductor testing apparatus of this FIG. 5 is elucidated.

The semiconductor testing apparatus 11 of this third embodiment comprises, in a control unit 12 an optimization processing part 13 and a register part 14, in place of the optimization processing unit 5 of the first Embodiment and the optimization processing unit 10 and the register 7 of the second Embodiment.

In other words, a step of optimization process faculty and register faculty is combined in software for operating the control unit 12. Thereby, the control unit 12 play a role of the respective processing units 5, 10 in accordance with the first Embodiment and the second Embodiment.

In this way, there is no need to improve the semiconductor testing apparatus mechanically, it is possible to further shorten the time to execute all functional tests of the semiconductor device using the testing program in a short time and with a moderate price.

Moreover as for those Embodiments, a memory means is made up of the register. But a memory means may be a memory that is, for example, a random access memory.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

We claim:

1. Semiconductor testing apparatus comprising:

control means for controlling respective parts of said semiconductor testing apparatus, recording means for storing plural testing programs for respective functional tests of a semiconductor device, measuring means for executing said functional test using the procedure of said testing programs, memory means for storing the latest statement concerning conditional setting for said measuring means, and optimization processing means including a conditional imperative statement part storing therein all statements concerning conditional setting for said measuring means, a first comparison part for comparing statement received from said control means with said respective statements stored in said conditional imperative statement part, and a second comparison part for comparing said statements received from said control means with said respective statements stored in said memory means, in said optimization processing means, upon receiving one of statements described in said testing programs from said control means, said first comparison part comparing said received statement with said respective statements stored in said conditional imperative statement part, and (i) when said received statement agrees with none of said statements stored in said conditional imperative statement part, said optimization processing means sends said received statement to said measuring means, or (ii) when said received statement agrees with one of said statements stored in said conditional imperative statement part, said second comparison part compares said received statement with said respective statements stored in said memory means, and (ii-1) when said received statement agrees with one of said statements stored in said memory means, said optimization processing means sends a completion output to said control means, or (ii-2) when said received statement agrees with none of said statements stored in said memory means, said optimization processing means sends a completion output to said control means after revising said received statement in said memory means and again setting condition of said measuring means by said optimization processing means.

2. Semiconductor testing apparatus comprising:

control means for controlling respective parts of said semiconductor testing apparatus, recording means for storing plural testing programs for respective functional tests of a semiconductor device, measuring means for executing said functional test using the procedure of said testing programs, memory means for storing the latest statement concerning conditional setting for said measuring means, and optimization processing means including a conditional imperative statement part storing therein all statements concerning conditional setting for said measuring means, a first comparison part for comparing said statement received from said control means with said respective statements stored in said conditional imperative statement part, a second comparison part for comparing said statement received from said control means with said respective statements stored in said memory means, a judgement part for judging whether said statement received from said control means is a statement concerning power-off for said measuring means or not, a power-off imperative statement part for storing said statement concerning power-off for said measuring part, a specific imperative statement part storing therein specific statements which may adversely influence upon said semiconductor device and said semiconductor testing apparatus at execution during power-on of said measuring means, and a third comparison part for comparing said statement received from said control means with said respective specific statements stored in said specific imperative part, in said optimization processing means, upon receiving one of statements described in said testing programs from said control means, said judgement part judges whether said received statement is said statement concerning power-off for said measuring means, and (i) when said received statement is said statement concerning power-off for said measuring means, said optimization processing means does not execute said received statement and stores said received statement in said power-off imperative statement part, or (ii) when said received statement is not said statement concerning power-off for said measuring means, said first comparison part compares said received statement with said respective statements stored in said conditional imperative statement part, and (ii-1) when said received statement agrees with none of said statements stored in said conditional imperative statement part, said optimization processing means sends said received statement to said measuring means, or (ii-2) when said received statement agrees with one of said statements stored in said conditional imperative statement part, said second comparison part compares said received statement with said respective statements stored in said memory means, and (ii-2-1) when said received statement agrees with one of said statements stored in said memory means, said optimization processing means sends a completion output to said control means, or (ii-2-2) when said received statement agrees with none of said statements stored in said memory means, said third comparison part compares said received statement with said respective specific statements stored in said specific imperative statement part, and (ii-2-2-1) when said received statement agrees with one of said specific statements stored in said specific imperative statement part, said optimization processing means executes said statement concerning said power-off for said measuring means stored in said power-off imperative statement part and said optimization processing means sends a completion output to said control means after revising said received statement in said memory means and again setting condition of said measuring means by said optimization processing means, or (ii-2-2-2) when said received statement agrees with one of said specific statements stored in said specific imperative statement part, said optimization processing means sends a completion output to said control means after revising said received statement in said memory means and again setting condition of said measuring means by said optimization processing means without executing said statement concerning said power-off for said measuring means.

3. Semiconductor testing apparatus in accordance with claim 1, wherein:

said measuring means is composed of plural units, and said optimization processing unit judges whether said units is set condition again or not.

4. Semiconductor testing apparatus in accordance with claim 2, wherein:

said measuring means is composed of plural units, and said optimization processing unit judges whether said units is set condition again or not.

5. Semiconductor testing apparatus in accordance with claim 2, wherein:

said measuring means is composed of plural units, and said optimization processing unit judges whether it is turned off power to said respective units or not.

6. Semiconductor testing apparatus in accordance with claim 4, wherein:

said measuring means is composed of plural units, and said optimization processing unit judges whether it is turned off power to said respective units or not.

7. Semiconductor testing apparatus in accordance with claim 1, wherein:

said control means includes faculty of said optimization processing means and said memory means.

8. Semiconductor testing apparatus in accordance with claim 2, wherein:

said control means includes faculty of said optimization processing means and said memory means.

9. Semiconductor testing apparatus in accordance with claim 3, wherein:

said control means includes faculty of said optimization processing means and said memory means.

10. Semiconductor testing apparatus in accordance with claim 4, wherein:

said control means includes faculty of said optimization processing means and said memory means.

11. Semiconductor testing apparatus in accordance with claim 5, wherein:

said control means includes faculty of said optimization processing means and said memory means.

12. Semiconductor testing apparatus in accordance with claim 6, wherein:

said control means includes faculty of said optimization processing means and said memory means.

* * * * *